(12) United States Patent
Lee

(10) Patent No.: US 11,909,195 B2
(45) Date of Patent: Feb. 20, 2024

(54) ELECTRONIC DEVICE WITH OVERCURRENT PROTECTION AND METHOD FOR OVERCURRENT PROTECTION

(71) Applicant: Samsung Electronics Co., Ltd., Suwon-si (KR)

(72) Inventor: Jehwan Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 724 days.

(21) Appl. No.: 17/046,133

(22) PCT Filed: Sep. 1, 2020

(86) PCT No.: PCT/KR2020/011714
§ 371 (c)(1),
(2) Date: Oct. 8, 2020

(87) PCT Pub. No.: WO2021/045486
PCT Pub. Date: Mar. 11, 2021

(65) Prior Publication Data
US 2023/0155366 A1 May 18, 2023

(30) Foreign Application Priority Data
Sep. 2, 2019 (KR) .......................... 10-2019-0108452

(51) Int. Cl.
*H02H 3/08* (2006.01)
*H02H 3/087* (2006.01)
(Continued)

(52) U.S. Cl.
CPC ............ *H02H 3/087* (2013.01); *H02H 1/003* (2013.01); *H02H 3/0935* (2013.01)

(58) Field of Classification Search
CPC ........ H02H 3/087; H02H 3/0935; H02H 1/003
See application file for complete search history.

(56) References Cited

U.S. PATENT DOCUMENTS 5,818,671 A * 10/1998 Seymour ............... H02H 1/0015
361/87
2009/0027818 A1 1/2009 Adi
(Continued)

FOREIGN PATENT DOCUMENTS

JP 11289749 A 10/1999
JP 2018050157 A 3/2018
(Continued)

OTHER PUBLICATIONS

Search Report and written opinion dated Dec. 22, 2020, issued in International Application No. PCT/KR2020/011714.

*Primary Examiner* — Scott Bauer
(74) *Attorney, Agent, or Firm* — Jefferson IP Law, LLP

(57) ABSTRACT

An electronic device having an overcurrent protection function is provided. The electronic device includes at least one power converter, the at least one power converter including a power conversion unit to convert input voltage or input current to supply output current, a control unit to adjust the output current, and an overcurrent protection unit to detect the output current and transmit a detection result to the control unit, and wherein the overcurrent protection unit includes an overcurrent extraction module to output a difference between the output current exceeding designated first reference current and the first reference current; a calculation module to calculate an accumulative value obtained by integrating the difference with respect to time, and a first comparison module to compare the accumulative value with a designated critical value and to transmit a first detection result in which the accumulative value exceeds the critical value to the control unit.

17 Claims, 16 Drawing Sheets

(51) Int. Cl.
  *H02H 1/00*   (2006.01)
  *H02H 3/093*   (2006.01)

(56) References Cited

U.S. PATENT DOCUMENTS

| | | |
|---|---|---|
| 2012/0049829 A1 | 3/2012 | Murakami |
| 2017/0338746 A1* | 11/2017 | Chen ................. H02M 3/33507 |
| 2018/0145530 A1 | 5/2018 | Lee et al. |
| 2018/0358898 A1 | 12/2018 | Yamaguchi et al. |
| 2019/0123546 A1* | 4/2019 | Wang ...................... H02M 1/32 |

FOREIGN PATENT DOCUMENTS

| | | |
|---|---|---|
| JP | 2018-183034 A | 11/2018 |
| KR | 10-1370739 B1 | 3/2014 |
| KR | 10-2019-0019289 A | 2/2019 |

\* cited by examiner

ELECTRONIC DEVICE WITH OVERCURRENT PROTECTION AND METHOD FOR OVERCURRENT PROTECTION

CROSS-REFERENCE TO RELATED APPLICATION(S)

This application is a U.S. National Stage application under 35 U.S.C. § 371 of an International application number PCT/KR2020/011714, filed on Sep. 1, 2020, which is based on and claimed priority of a Korean patent application number 10-10-2019-0108452, filed on Sep. 2, 2019, in the Korean Intellectual Property Office, the disclosure of which is incorporated by reference herein in its entirety.

TECHNICAL FIELD

The disclosure relates to an electronic device having an overcurrent protection function and an overcurrent protection method.

BACKGROUND ART

An electronic device includes devices such as semiconductors or passive components that consume power, and each device must be supplied with power corresponding to rated voltage and rated current. In order to supply corresponding power to each device, the electronic device employs a plurality of power converters.

The power converter is a device that converts the level of input power, converts alternate current (AC) power to direct current (DC) power, or converts DC power to AC power.

DISCLOSURE OF INVENTION

Technical Problem

The electronic device includes a power converter that processes input power to supply power which is required by devices in the electronic device and corresponds to the rated voltage and rated current of the devices. The power converter may output the rated current to supply power required by the devices in the electronic device. However, the power converter may output overcurrent exceeding the rated current due to various factors. When the overcurrent is output from the power converter, the devices in the electronic device may be overheated and damaged, so that the electronic device may perform an operation for protecting the overcurrent. For example, the electronic device may perform a protection operation when an output of overcurrent exceeding a designated threshold value (e.g., a certain percentage of the rated current {e.g., 120% to 150%} or more) is detected from the power converter.

In general, the electronic device performs the protection operation for a case in which overcurrent exceeding the threshold value is output. However, even when the power converter outputs current larger than the rated current and smaller than the threshold value for a predetermined time or longer, overheating and damage of the devices in the electronic device may be caused.

One embodiment may detect whether current output from a power converter exceeds a threshold value or whether current larger than rated current and smaller than a threshold value is output for a predetermined time or longer, and may provide an overcurrent protection function based on the detection result.

The technical problems to be achieved in this document are not limited to the technical problems mentioned above, and other technical problems that are not mentioned can be clearly understood by those skilled in the art from the following description.

Solution to Problem

The electronic device includes, at least one power converter, and the at least one power converter may include: a power conversion unit configured to convert an input voltage or an input current to supply an output current, a control unit configured to adjust the output current; and an overcurrent protection unit configured to detect the output current and to transmit a detection result to the control unit. The overcurrent protection unit may include an overcurrent extraction module configured to output a difference between the output current exceeding designated first reference current and the first reference current; a calculation module configured to calculate an accumulative value obtained by integrating the difference with respect to time; and a first comparison module configured to compare the accumulative value with a designated threshold value and to transmit a first detection result in which the accumulative value exceeds the threshold value to the control unit.

The electronic device includes, at least one power converter, and the at least one power converter may include: a power conversion unit configured to convert an input voltage or an input current to supply an output current, and an overcurrent protection unit configured to detect the output current and to transmit a detection result to the power conversion unit to adjust the output current. The overcurrent protection unit may include: an overcurrent extraction module configured to output a difference between the output current exceeding designated first reference current and the first reference current; a calculation module configured to calculate an accumulative value obtained by integrating the difference with respect to time; and a first comparison module configured to compare the accumulative value with a designated threshold value and to transmit a first detection result in which the accumulative value exceeds the threshold value to the power conversion unit.

An overcurrent protection method of an electronic device includes, converting an input voltage or an input current to supply an output current, outputting a difference between the output current exceeding designated first reference current and the first reference current, calculating an accumulative value obtained by integrating the difference with respect to time, comparing the accumulative value with a designated value and transmitting a first detection result in which the accumulative value exceeds the threshold value.

Each of the various aspects and features of the disclosure is defined in the appended claims. Combinations of the features of the dependent claims may be suitably combined with the features of the independent claims, as well as those explicitly presented in the claims.

In addition, one or more features selected from any one embodiment described in disclosure may be combined with one or more features selected from any other embodiment described in the disclosure, and alternative combinations of these features at least partially alleviate one or more technical issues discussed in the disclosure, or at least partially alleviate technical issues that is discernable by those skilled in the art from the disclosure. Furthermore, the combinations are possible unless the specific combinations or permutations thus formed of the embodiment features are understood to be incompatible by one skilled in the art.

In any described example implementation described in the disclosure, two or more physically separate components may alternatively be integrated into a single component if the integration is possible. If the same function is performed by the single component formed in this manner, the integration is possible. Conversely, a single component of any embodiment described in the disclosure may alternatively, if appropriate, be implemented with two or more separate components that achieve the same function.

The purpose of certain embodiments of the disclosure is to at least partially, at least partially, solve, mitigate or eliminate one of the problems and/or disadvantages associated with the prior art. Certain embodiments aim to provide at least one of the advantages described below.

Advantageous Effects of Invention

An electronic device according to an embodiment may accumulate overcurrent larger than rated current and smaller than a threshold value and may protect the overcurrent exceeding the threshold value, thereby quickly responding to abnormal operations of devices in the electronic device and preventing overheating and damage of the devices in the electronic device.

An electronic device according to an embodiment may protect the accumulation of overcurrent larger than rated current and smaller than a threshold value, thereby effectively utilizing peak current characteristics for each operation time of semiconductors and passive components in the electronic device.

An electronic device according to an embodiment may adjust a protection operation against overcurrent larger than rated current and smaller than a threshold value, so that the electronic device may be designed with components having minimum component rating corresponding to the rated current in consideration of peak current characteristics of the components of the electronic device and the material costs and the size of the components may be reduced.

The effects obtainable in the disclosure are not limited to the above-mentioned effects, and other effects not mentioned may be clearly understood by those skilled in the art from the following description.

BEST MODE FOR CARRYING OUT THE INVENTION

Figure 1:
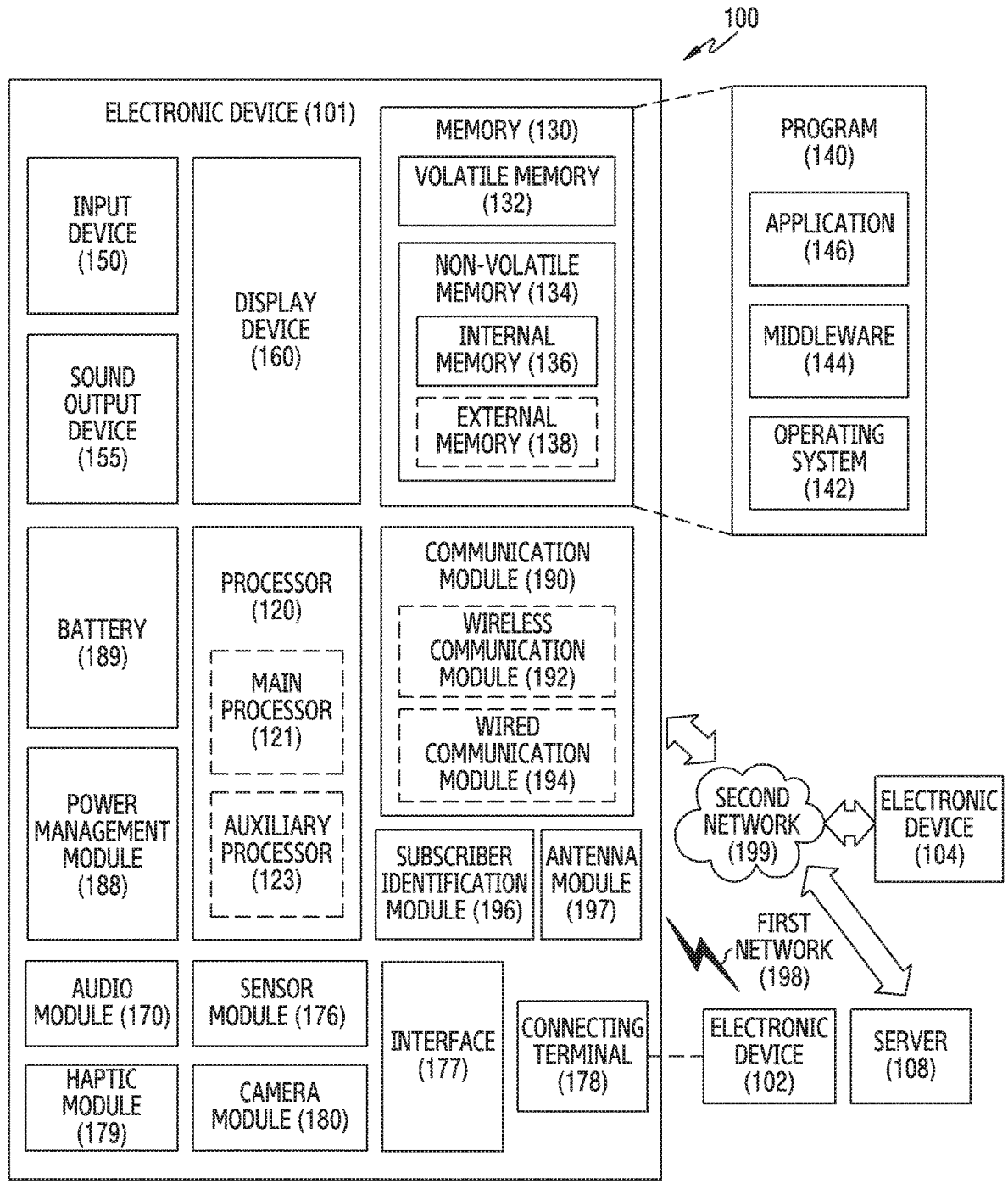
FIG. 1 illustrates an electronic device in a network environment according to an embodiment of the disclosure.

Hereinafter, embodiments of the document are described with reference to the accompanying drawings. FIG. 1 is a block diagram illustrating an electronic device in a network environment according to an embodiment of the disclosure. Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199

(e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., printer circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), a serial peripheral interface (SPI), or a mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
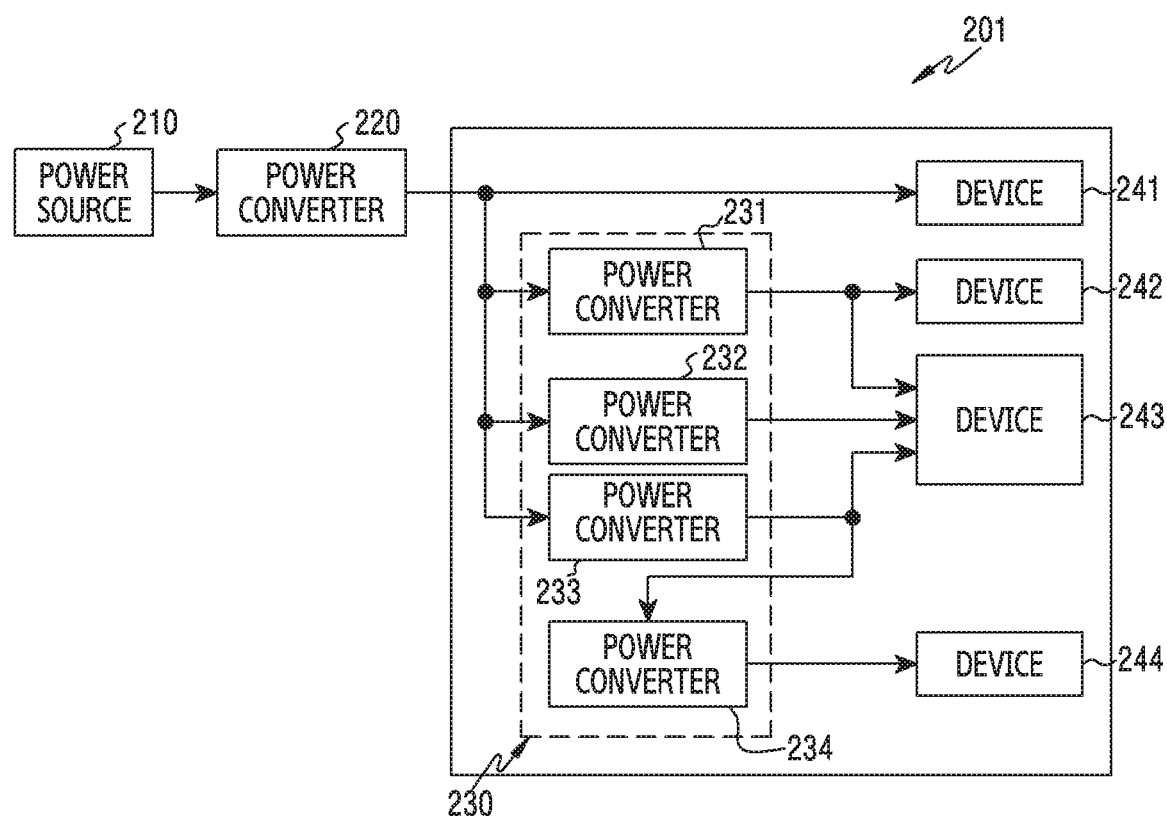
FIG. 2 is a diagram illustrating an example of implementing an electronic device including at least one power converter according to an embodiment of the disclosure.

FIG. 2 illustrates an example of implementing an electronic device including at least one power converter according to an embodiment of the disclosure.

Referring to FIG. 2, an electronic device 201 (e.g., the electronic device 101 of FIG. 1) including at least one power converter according to an embodiment may include at least one power converter 230 including power converters 231, 232, 233 and 234 and devices 241, 242, 243, and 244 in the electronic device 201. The at least one power converter 230 may be configured to convert input power into power having different current, voltage, or frequency, and to supply the converted power to other power converters or the devices 241, 242, 243, and 244 in the electronic device.

The at least one power converter 230 of the example illustrated in FIG. 2 is a single output power converter, and the single output power converter may convert one input power to supply one output power. In addition, the at least one power converter 230 of the example illustrated in FIG. 2 is a built-in power converter disposed inside the electronic device, and may be supplied with power from an external power converter 220 disposed outside the electronic device.

The power source 210 may supply power to the outside. In this example, the power source 210 and the external power converter 220 may be configured to supply power from the outside of the electronic device 201, but are not limited thereto. The power source 210 and the external power converter 220 may be built in the electronic device 201 to supply power to the electronic device. For example, the power source 210 may be the battery 189 illustrated in FIG. 1, and the external power converter may be one component of the power management module 188 illustrated in FIG. 1.

The devices 241, 242, 243, and 244 are responsible for various functions that the electronic device 201 should have, and may be, for example, the processor 120, the display device 160, etc., included in the electronic device 101 of FIG. 1. The built-in power converter 230 may process the input power transmitted from the power source 210 or the external power converter 220 to supply power corresponding to rated voltage and rated current required by the devices 241, 242, 243, and 244 in the electronic device 201. The manner in which the at least one power converter 230 supplies power to the devices 241, 242, 243, and 244 is not limited to the illustration of FIG. 2, and the devices 241, 242, 243, and 244 in the electronic device 201 may require single or multiple power sources, so that the electronic device may be variously implemented according to the output of the power converter 230 and the power demand of the devices 241, 242, 243, and 244 in the electronic device.

In addition, each of the devices 241, 242, 243, and 244 has a limit of the allowable power, and in order for the electronic device 201 to be safely and smoothly used, appropriate voltage, current, and power should be supplied to the devices 241, 242, 243, and 244 which are called rated voltage, rated current, and rated power. When overvoltage exceeding rated voltage or overcurrent exceeding rated current is supplied to the devices 241, 242, 243, and 244, it may cause overheating and damage of the devices 241, 242, 243, and 244. In addition, although the devices can withstand a low overcurrent condition for a short time, when the overcurrent condition persists even if it is high overcurrent or low overcurrent exceeding a threshold, functional damage of the electronic device 201 and the at least one power converter 230 employed in the electronic device 201 may be caused. Therefore, the electronic device 201 may include an overcurrent protection function (or an overcurrent protection circuit) to supply a current within a safe operating range.

Figure 3:
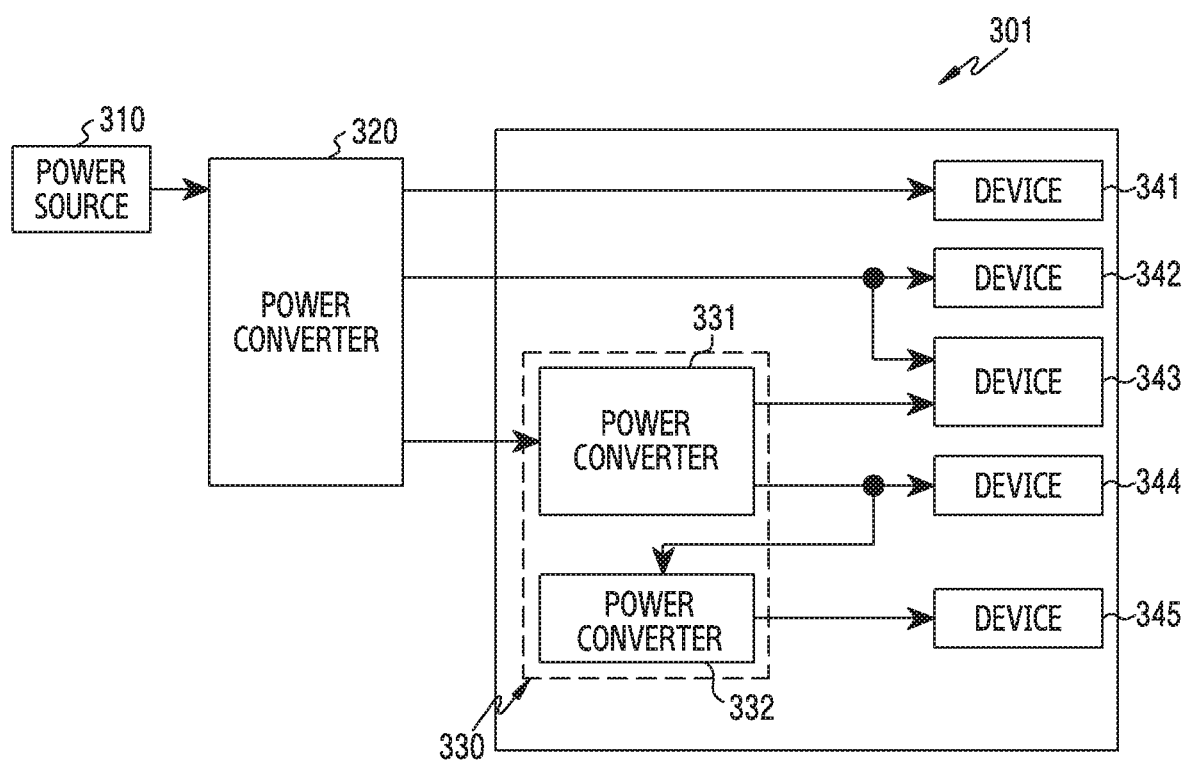
FIG. 3 is a diagram illustrating another example of implementing an electronic device including at least one power converter according to an embodiment of the disclosure.

FIG. 3 is a diagram illustrating another example of implementing an electronic device including at least one power converter according to an embodiment of the disclosure.

Referring to FIG. 3, an electronic device 301 including at least one power converter, as in the example illustrated in FIG. 2, may include at least one power converter 330 and devices 341, 342, 343, 344, and 354 in the electronic device 301. The at least one power converter 330 may be configured to convert input power into power having different current, voltage, or frequency and to supply the converted power to other power converters or the devices 341, 342, 343, 344, and 354 in the electronic device. However, some of an external power converter 320 and the at least one power converter 330 may include power converters 320 and 331 including a plurality of output terminals, unlike the example illustrated in FIG. 2. The power converters 320 and 331 may include one input terminal and the plurality of output terminals, and the plurality of output terminals may output different rated voltage and/or rated current from each other. For example, input power may be divided and processed by a plurality of power conversion circuits so that the power converters 320 and 331 may output a plurality of power sources.

Figure 4A:
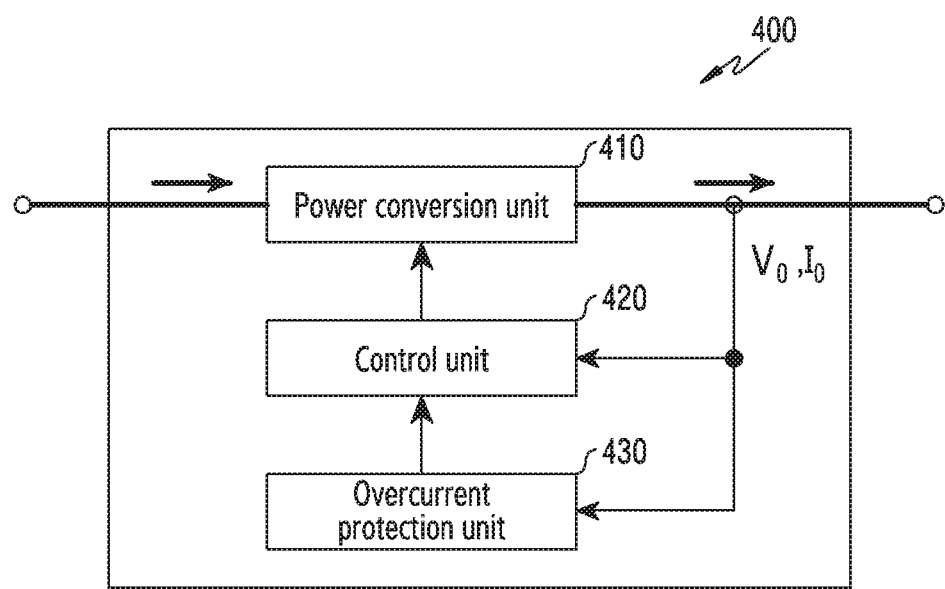
FIG. 4A is a block diagram illustrating a power converter according to an embodiment of the disclosure.
Figure 4B:
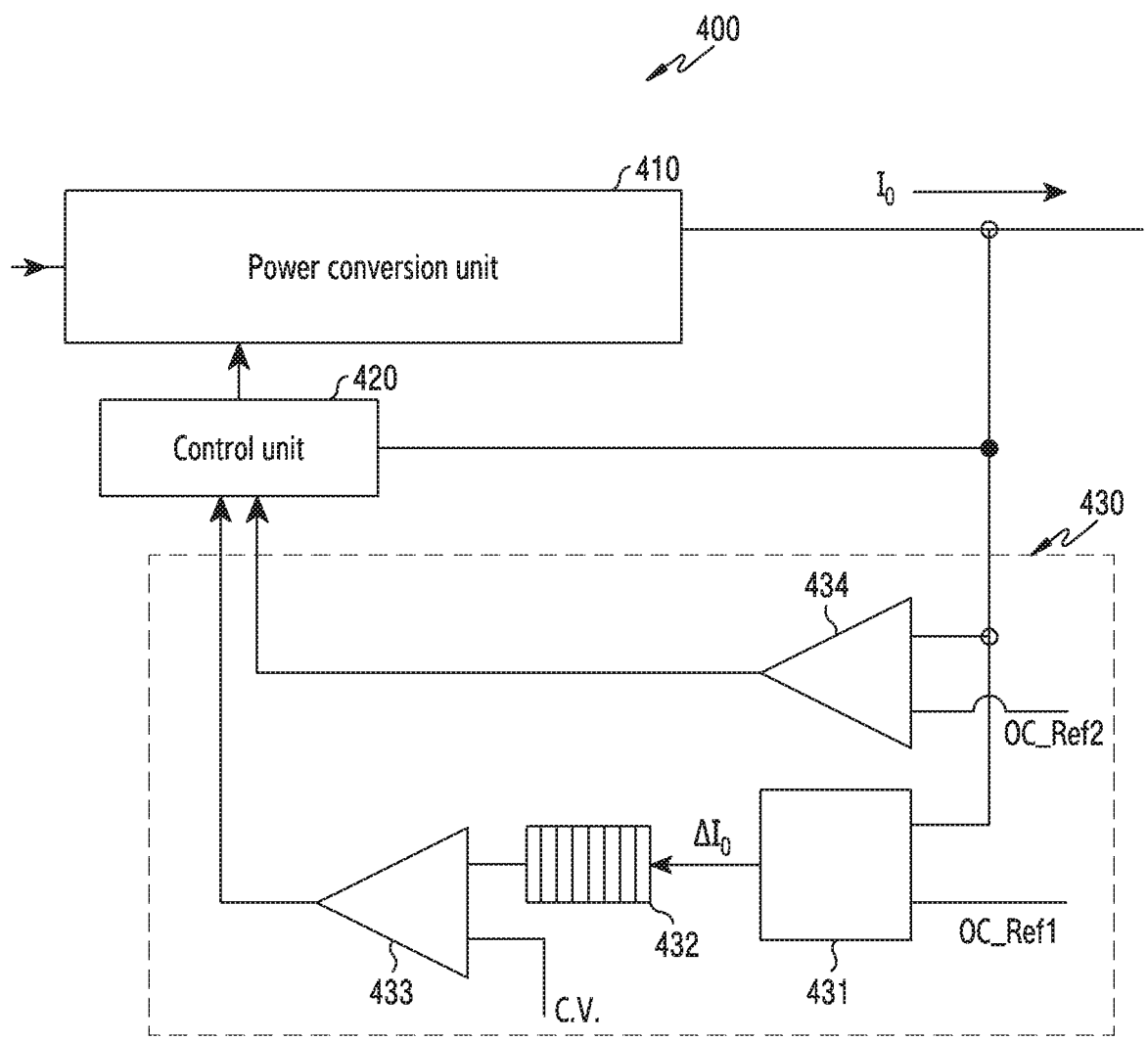
FIG. 4B is a configuration diagram illustrating a power converter according to an embodiment of the disclosure.

FIG. 4A is a block diagram illustrating a power converter according to an embodiment of the disclosure. FIG. 4B is a configuration diagram illustrating a power converter according to an embodiment of the disclosure. Referring to FIG. 4A, a power converter 400 according to an embodiment may include a power conversion unit 410, a control unit 420, and an overcurrent protection unit 430.

The power conversion unit 410 may convert input voltage or input current to match an output condition and may supply output current Io to devices in the electronic devices 101, 201, and 301. The power conversion unit 410 may function to convert input power to power having different current, voltage, or frequency, and may convert, for example, AC power into DC power and may convert a DC voltage level. It is not limited to the above examples. In addition, the power conversion unit 410 may include a semiconductor power converter using a semiconductor device.

The control unit 420 may detect output voltage Vo and/or output current Io output from the power conversion unit 410, and may control the power conversion unit 410 to adjust the output voltage Vo within a rated range. According to an embodiment, the control unit 420 may be configured to detect the output current Io output from the power conversion unit 410 and to receive a processing result from the overcurrent protection unit 430 to control the power conversion unit 410, thereby performing an overcurrent protection operation.

Referring to FIG. 4B, the overcurrent protection unit 430 may detect output current output from the power conversion unit 410, may derive a detection result indicating the occurrence of overcurrent requiring overcurrent protection, and may transmit the detection result to the control unit 420. The overcurrent protection unit 430 according to an embodiment may include an overcurrent extraction module 431, a calculation module 432, a first comparison module 433, and a second comparison module 434.

The overcurrent extraction module 431 may output a difference between the output current Io, which is output from the power conversion unit 410 and exceeds predetermined first reference current, and the first reference current. The first reference current may be designated in advance as the rated current of the power converter 400, and may be designated in advance in the memory 130 shown in FIG. 1. The output current exceeding the first reference current may be defined as overcurrent exceeding the rated current. For example, the overcurrent extraction module 431 may receive two input signals and may output a single output signal. The two input signals may respectively correspond to the output current Io output from the power converter and the first reference current, and a single output signal may correspond to a difference $\Delta$Io between the output current Io exceeding the first reference current and the first reference current. In addition, the overcurrent extraction module 431 may identify whether the output current Io exceeds the first reference current, and may output the difference $\Delta$Io between the output current Io and the first reference when the output current Io exceeds the first reference current.

The overcurrent extraction module 431 may use a differential amplifier to output the difference between the output current and the first reference current. In the case of using the differential amplifier, voltage at which the output current exceeding the predetermined first reference current is converted and voltage at which the first reference current is converted may be input to two input terminals of the differential amplifier, and one output terminal of the differential amplifier may output voltage at which a difference between the output current exceeding the predetermined first reference current and the first reference current is converted. In addition, since the difference output from the differential amplifier is output as an analog signal, the overcurrent extraction module 431 may further include an analog-to-digital converter (ADC) to convert the difference into digital data.

The calculation module 432 may calculate an accumulative value obtained by integrating the difference between the output current exceeding the first reference current output from the overcurrent extraction module 431 and the first reference current with respect to time, and may transmit the calculated accumulative value to the first comparison module 433. For example, the accumulative value may be a certain area (B or C) shaded in the graph shown in FIG. 7. For example, in order for the calculation module 432 to calculate the accumulative value, an integrator that integrates the output signal of the overcurrent extraction module with respect to time may be used, but the disclosure is not limited thereto. Further, according to an embodiment, the calculation module 432 may initialize the accumulative value at a predetermined time period. For example, the calculation module 432 may initialize the accumulative value calculated every 5 minutes. By initializing the accumulative value at a constant period, it is possible to prevent the overcurrent protection operation from being performed when the low overcurrent condition does not persist.

The first comparison module 433 may compare the accumulative value calculated by the calculation module 432 with a predetermined critical value, and may transmit a first detection result to the control unit 420 when the accumulative value exceeds the predetermined critical value. The first detection result may correspond to the occurrence of overcurrent that requires overcurrent protection, and the critical value may be a criterion for determining whether the overcurrent requiring overcurrent protection occurs. For example, the first comparison module 433 may receive two input signals and may output a single output signal. The two input signals may respectively correspond to the accumulative value and critical value transmitted by the calculation module, and the single output signal may correspond to a first detection result corresponding to the occurrence of the overcurrent requiring overcurrent protection. For example, the first comparison module 433 may include a comparator that compares two different input signals to identify whether there is a difference in their sizes, and may notify the identification result as an output signal.

A low overcurrent condition for a short time period may not require protection, but when the overcurrent condition persists even if the overcurrent is low, it may cause functional damage of the power converter 400 and the devices that receive the output current of the power converter 400. Accordingly, an electronic device (e.g., the electronic device 101 of FIG. 1, the electronic device 201 of FIG. 2, and the electronic device 301 of FIG. 3) including the power converter 400 may perform an overcurrent protection function. When the overcurrent protection operation is performed under the condition that an accumulated value indicating the continuation of the overcurrent state exceeds a predetermined critical value, effective overcurrent protection is possible. In addition, when the overcurrent protection condition can be adjusted, that is, when the overcurrent protection condition can be adjusted according to the designated critical value, the devices of the electronic device may effectively utilize peak current characteristic, whereby the efficiency of use compared to the rating of the devices can be increased.

The second comparison module 434 may compare the output current Io output from the power conversion unit 410 with a predetermined second reference current and may transmit a second detection result to the control unit 420 when the output current exceeds the second reference current. The second detection result may correspond to the occurrence of the overcurrent that requires overcurrent protection, and the second reference current may be a criterion for determining whether the overcurrent requiring overcurrent protection occurs. The second reference current is greater than the first reference current. For example, the second reference current may be generally designated as a constant value from 120% to 150% of the first reference current, but is not limited thereto.

The second comparison module 434 may receive two input signals and may output a single output signal. The two input signals may respectively correspond to the output current Io output from the power conversion unit 410 and the predetermined second reference current, and the single output signal may correspond to the second detection result corresponding to the occurrence of the overcurrent requiring overcurrent protection.

For example, the second comparison module 434 may include a comparator that compares two different input signals to identify whether there is a difference in their sizes and notifies the identification result as an output signal. When the comparator is used, voltage at which the output current Io output from the power converter is converted and voltage at which the second reference current is converted may be respectively input to two input terminals of the comparator, and the output terminal of the comparator may output the second detection result. In addition, in order to convert the output current Io output from the power converter into voltage, a resistor may be inserted between the power converter and the single input terminal of the comparator.

The overcurrent protection unit 430 may be configured to transmit the first detection result output from the first comparison module 433 or the second detection result output from the second comparison module 434 to the control unit 420. For example, in the first detection result, the overcurrent protection operation may be performed in the electronic devices 101, 201, and 301 including the power converter 400 under the condition in which an accumulative value indicating the continuation of a low overcurrent condition exceeding rated current exceeds a predetermined critical value, and in the second detection result, the overcurrent protection operation may be performed in the electronic devices 101, 201, and 301 including the power converter 400 under the condition in which the output current output from the power conversion unit 410 exceeds the second reference current. Accordingly, according to the disclosure, it is possible to effectively protect the electronic devices 101, 201, and 301 including the power converter 400 from side effects due to the overcurrent.

The control unit 420 may be configured to perform an overcurrent protection operation based on the first detection result or the second detection result transmitted from the overcurrent protection unit 430. The control unit 420 may stop the supply of the output current output from the power conversion unit 410 based on the first detection result or the second detection result. In addition, the control unit 420 may pause the supply of the output current output from the power conversion unit 410 based on the first detection result or the second detection result. The control unit 420 may be configured to turn on/off a switch in the power conversion unit 410 to stop or pause the supply of the output current.

The control unit 420 may define the overcurrent protection operation for stopping the output current output from the power conversion unit 410 as a first overcurrent protection operation, and the first overcurrent protection operation corresponds to an operation in which an operation-pause state is continuously maintained unless the power conversion unit 410 is manually restarted. The control unit 420 may define the overcurrent protection operation for pausing the output current output from the power conversion unit 410 as the second overcurrent protection operation, and the second overcurrent protection operation corresponds to an operation of stopping the operation of the power conversion unit 410 and automatically restarting the power conversion unit 410 after a predetermined time elapses. When the first and second overcurrent protection operations are performed, the electronic devices 101, 201, and 301 may lower a temperature raised due to the overcurrent.

Figure 11A:
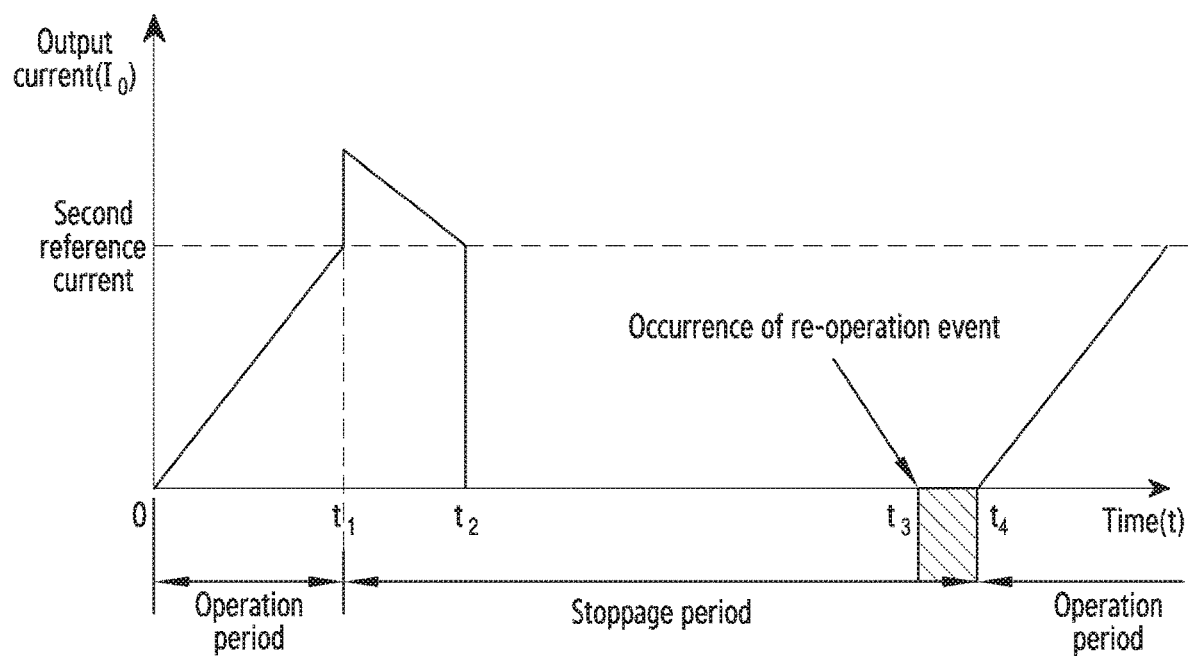
FIG. 11A is a graph illustrating a first overcurrent protection operation according to an embodiment of the disclosure.
Figure 11B:
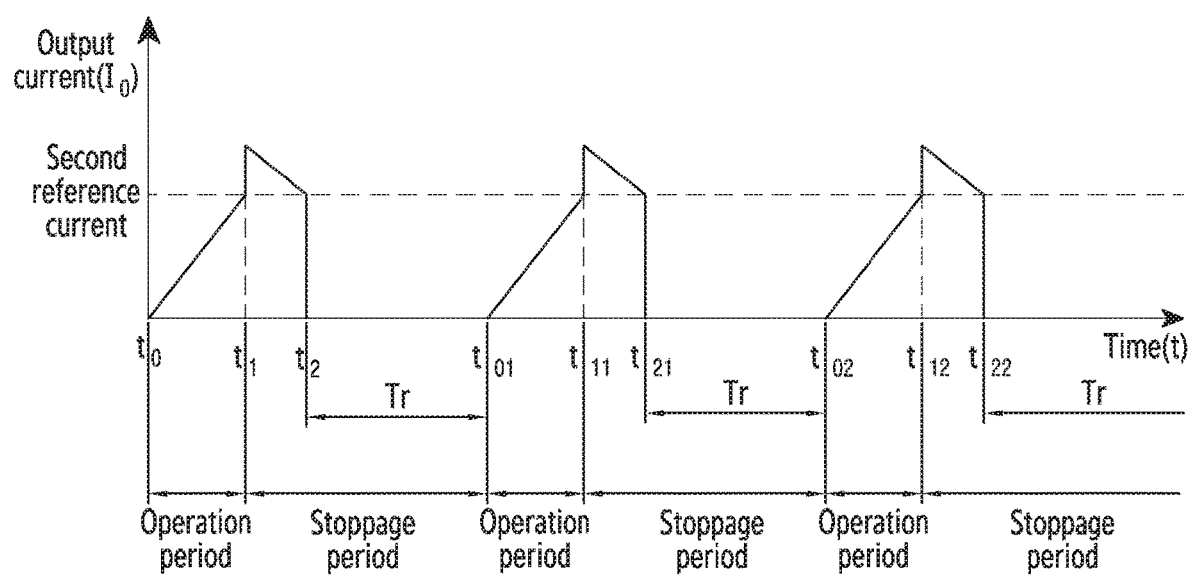
FIG. 11B is a graph illustrating a second overcurrent protection operation according to an embodiment of the disclosure.

FIG. 11A is a graph illustrating a first overcurrent protection operation according to an embodiment of the disclosure, and FIG. 11B is a graph illustrating a second overcurrent protection operation according to an embodiment of the disclosure.

Referring to FIG. 11A, the control unit 420 may stop the supply of the output current output from the power conversion unit 410 based on the first detection result or the second detection result at time t1, and an stoppage period (between t1 and t4) may be maintained unless the power conversion unit 410 is manually restarted. In this case, it may correspond to the first overcurrent protection operation. The output current becomes 0 at time t2 when a certain reaction time has elapsed from time t1, and when a re-operation event (e.g., reset through recycling after removing input power or operation of a predetermined reset circuit) occurs at time t3, the power converter may start the corresponding operation at time t4 when a certain reaction time has elapsed.

Referring to FIG. 11B, the control unit 420 may pause the supply of the output current output from the power conversion unit 410 based on the first detection result or the second detection result at time t1 (or time t11 or time t12), and may automatically restart the power conversion unit 410 after a predetermined time (from time t1 to time t01 or from time t11 to time t02). In this case, it may correspond to the second overcurrent protection operation. The output current becomes 0 at time t2 (or t21 or time t22) when a certain reaction time has elapsed from time t1, and from time t2 to time t01 (or time t21 to time t02), the power converter may be restarted at time t01 (or time t02) after having recovery time Tr.

In addition, the power converter 400 may further include a counter (not shown) that counts the number of times of the occurrence of the second overcurrent protection operation. When the control unit 420 is configured to perform the second overcurrent protection operation based on the first detection result and the second detection result, the counter may count the number of times of the occurrence of the second overcurrent protection operation. In addition, the control unit 420 may be configured to identify whether the number of times of the occurrence of the second overcurrent protection operation exceeds a predetermined number of times, and to switch from a second overcurrent protection mode to a first overcurrent protection operation mode when the number of occurrences of the second overcurrent protection operation exceeds a predetermined number of times.

In addition, the control unit 420 may be configured to alarm the stoppage of the operation of the power conversion unit 410 to the electronic device 101, 201, or 301 by performing the overcurrent protection operation. For example, when the control unit is electrically connected to the processor 120 of the electronic device 101, 201, or 301, the control unit may transmit, to the processor 120, a warning signal indicating that the overcurrent requiring overcurrent protection has occurred.

The electronic devices 101, 201, and 301 including the at least one power converter 400 according to an embodiment may further include a means (not shown) for displaying the operation state of the power conversion unit 410. For example, the means for displaying the operation state of the power conversion unit 410 may be operated by a control signal from the control unit 420. Alternatively, when the control unit 420 is configured to transmit, to the processor of the electronic device, the warning signal indicating that the overcurrent requiring overcurrent protection has occurred, the means for displaying the operation state of the power conversion unit 410 may be operated by the control signal from the processor 120.

According to an embodiment, at least some or all of the overcurrent extraction module 431, the calculation module 432, the first comparison module 433, and the second comparison module 434 of the overcurrent protection unit 430 may be configured with one chipset (e.g., the power management module 188 of FIG. 1). According to an embodiment, the overcurrent protection unit 43 and the control unit 420 may be configured with a single chipset (e.g., the power management module 188 of FIG. 1).

Figure 5A:
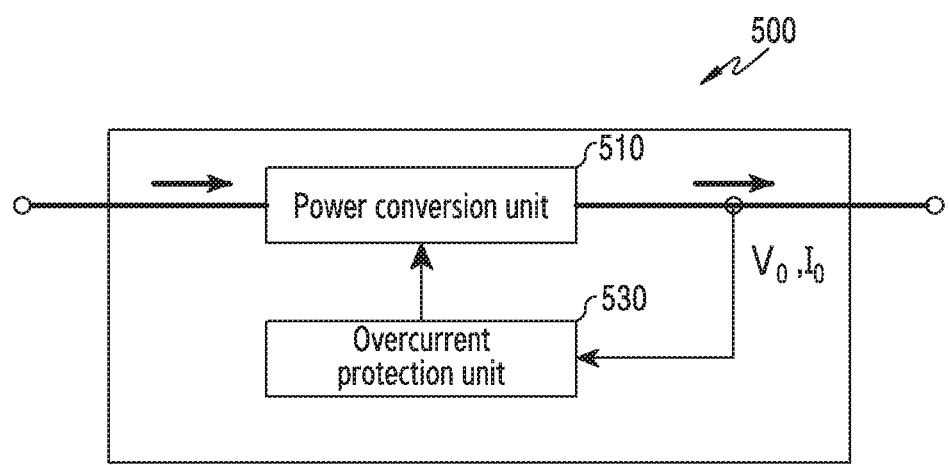
FIG. 5A is a block diagram illustrating a power converter according to an embodiment of the disclosure.
Figure 5B:
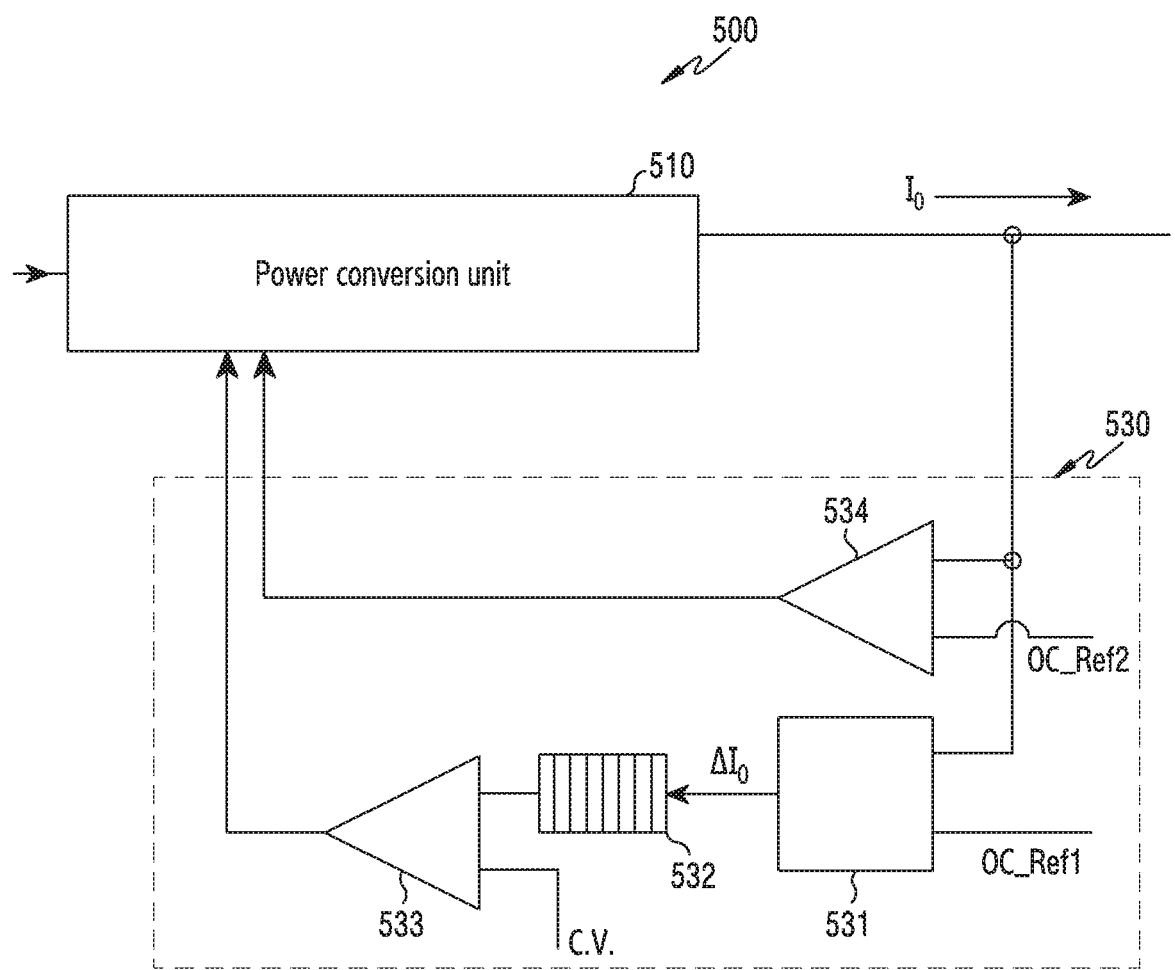
FIG. 5B is a configuration diagram illustrating a power converter according to an embodiment of the disclosure.

FIG. 5A is a block diagram illustrating a power converter according to an embodiment of the disclosure. FIG. 5B is a configuration diagram illustrating a power converter according to an embodiment of the disclosure. Referring to FIG. 5A, a power converter 500 according to another embodiment may include a power conversion unit 510 and an overcurrent protection unit 520.

The power conversion unit 510 according to another embodiment may be configured in the same manner as the power conversion unit 410 shown in FIG. 4A or 4B according to an embodiment, or may be configured to include some of the power conversion unit 410 and the control unit 420.

Referring to FIG. 5B, the overcurrent protection unit 530 according to another embodiment may be configured to detect output current output from the power conversion unit 510, to derive a detection result indicating the occurrence of overcurrent requiring overcurrent protection, and to transmit the detection result to the power conversion unit 510 to adjust the output current Io output from the power conversion unit 510. Accordingly, the overcurrent protection unit 530 may include an overcurrent extraction module 531, a calculation module 532, a first comparison module 533, and a second comparison module 534. The overcurrent protection unit 530 according to an embodiment may be configured in the same manner as the overcurrent protection unit 430 illustrated in FIG. 4B, except that the detection result is directly transmitted to the power conversion unit 510.

The overcurrent protection unit 530 according to another embodiment may be configured to transmit the first detection result output from the first comparison module 533 or the second detection result output from the second comparison module 534 to the power conversion unit 510. For example, in the first detection result, the overcurrent protection operation may be performed in the electronic devices 101, 201, and 301 including the power converter 500 under the condition in which an accumulative value indicating the continuation of a low overcurrent condition exceeding rated current exceeds a predetermined critical value, and in the second detection result, the overcurrent protection operation may be performed in the electronic devices 101, 201, and 301 including the power converter 500 under the condition in which the output current output from the power conversion unit 510 exceeds the second reference current. Accordingly, according to the disclosure, it is possible to effectively protect the electronic devices 101, 201, and 301 including the power converter 500 from side effects due to the overcurrent.

The power converter 500 according to another embodiment may be configured to perform the overcurrent protection operation when the first detection result or the second detection result is transmitted from the overcurrent protection unit 530. The overcurrent protection operation according to another embodiment may be the same as the overcurrent protection operation performed by the power converter 400 according to an embodiment. For example, the overcurrent protection unit 530 may transmit the first detection result or the second detection result to the power conversion unit 510 to stop the supply of the output current output from the power conversion unit 510. In addition, the overcurrent protection unit 530 may transmit the first detection result or the second detection result to the power conversion unit 510 to pause the supply of the output current output from the power conversion unit 510. The overcurrent protection unit 530 may be configured to turn off a switch in the power conversion unit 510 to stop or pause the supply of the output current.

Figure 6:
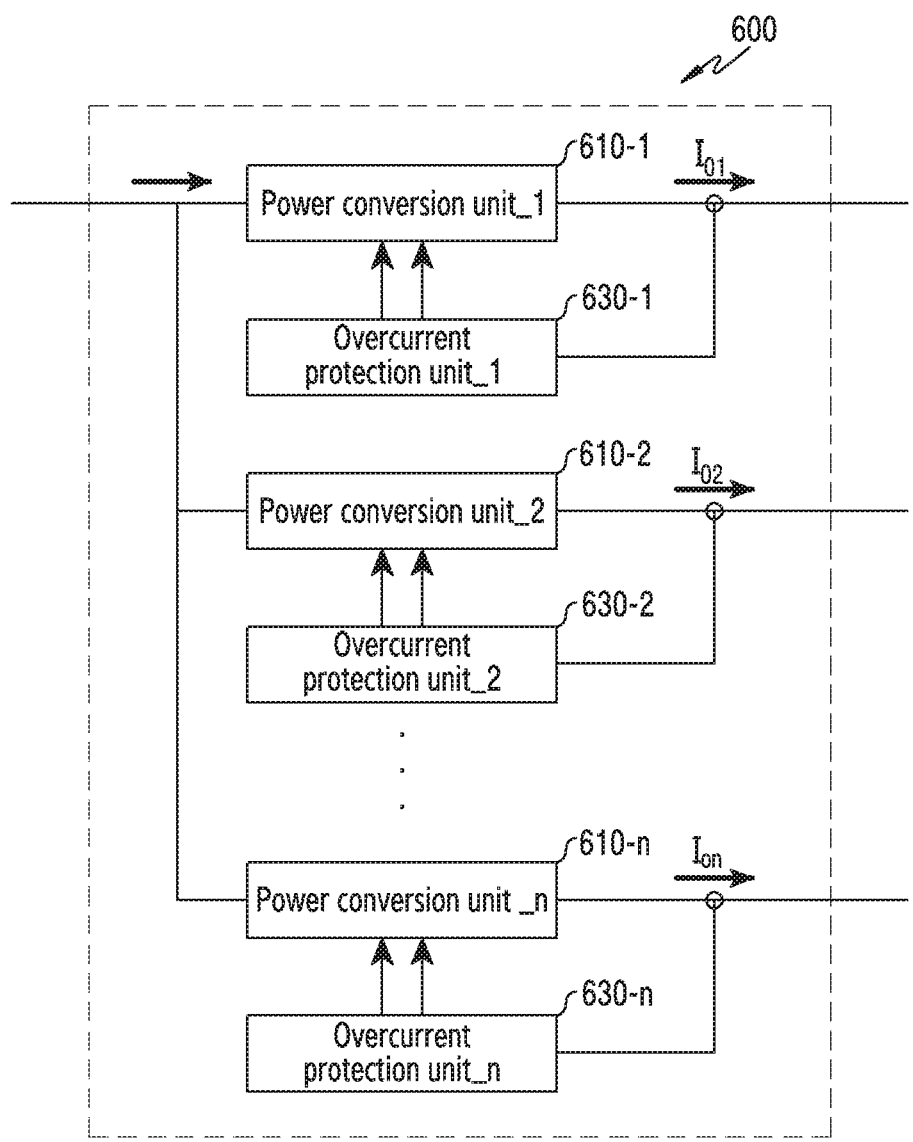
FIG. 6 is a block diagram illustrating a power converter according to still an embodiment of the disclosure.

FIG. 6 is a block diagram illustrating a power converter according to still an embodiment of the disclosure.

Referring to FIG. 6, a power converter 600 according to still another embodiment shows an example of the plurality of output power converters 320 and 331 illustrated in FIG. 3. The power converter 600 may include a plurality of power conversion units 610-1, 610-2, and 610-n and a plurality of overcurrent protection units 630-1, 630-2, and 630-n. The plurality of power conversion units 610-1, 610-2, and 610-n may be operatively connected to the plurality of overcurrent protection units 630-1, 630-2, and 630-n, respectively. The plurality of power conversion units 610-1, 610-2, and 610-n may perform overcurrent protection by feedback for the output current provided by the plurality of connected overcurrent protection units 630-1, 630-2, and 630-n, respectively. The plurality of overcurrent protection units 630-1, 630-2, and 630-n according to still another embodiment may be configured in the same manner as that in the overcurrent protection unit 430 according to an embodiment or the overcurrent protection unit 530 according to another embodiment. In addition, the plurality of power conversion units 610-1, 610-2, and 610-*n* may be operatively connected to the control unit 420 according to an embodiment, respectively. However, the disclosure is not limited thereto, and one control unit may be operatively connected to the plurality of power conversion units 610-1, 610-2, and 610-*n*.

Figure 7:
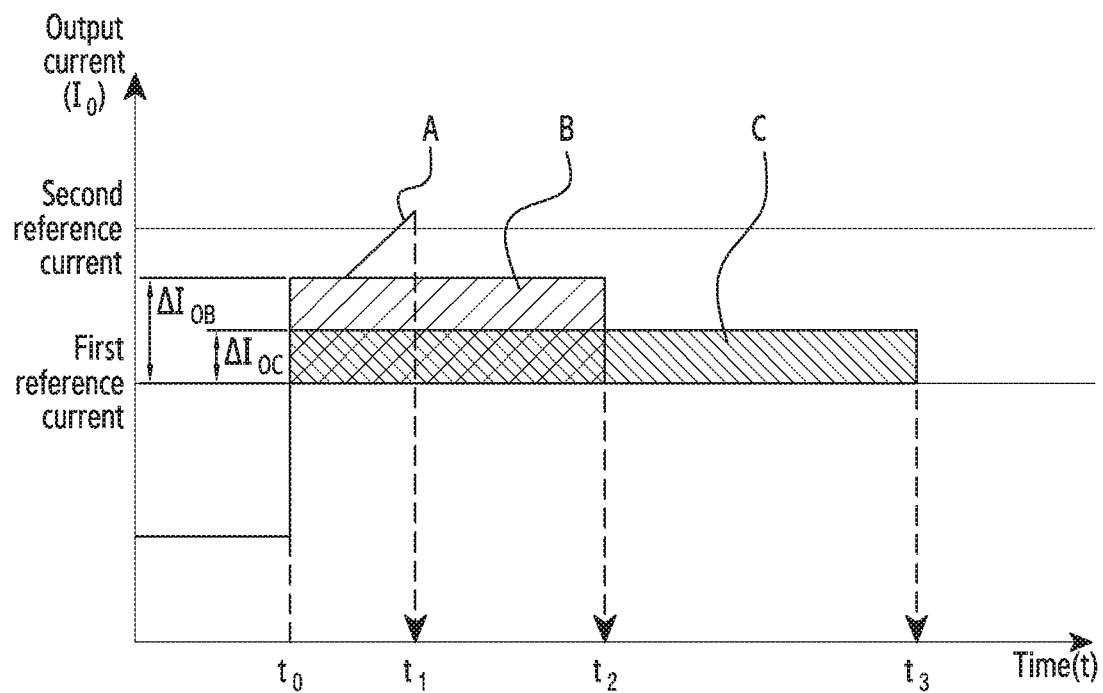
FIG. 7 is a graph of output current according to time illustrating an occurrence condition of an overcurrent protection operation according to an embodiment of the disclosure.

FIG. 7 is a graph of output current according to time illustrating an occurrence condition of an overcurrent protection operation according to an embodiment of the disclosure.

Referring to FIG. 7, the output current shown in the graph may be output from a power converter (e.g., the at least one power converter 230 of FIG. 2, the at least one power converter 330 of FIG. 3, the power converter 400 of FIG. 4A or 4B, or the power converter 500 of FIG. 5A or 5B). When the output current does not exceed a first reference current, the electronic devices 101, 201, and 301 including the power converter according to an embodiment may be stably operated.

FIG. 7 illustrates three types of output current that can be output from a power converter according to an embodiment. First, type A corresponds to a case in which the output current exceeds second reference current larger than first reference current while the output current is changed and output over time. In type A, the overcurrent protection units 430 and 530 of the power converter may transmit a second detection result in which the output current exceeds the second reference current to the control unit 420 that controls the power conversion unit 510 or the power conversion unit 410, whereby the output current may be stopped or paused at t1. That is, when the output current exceeds the second reference current, the overcurrent protection operation may be performed in the electronic devices 101, 201, and 301.

Type B or C corresponds to a case in which the overcurrent that does not exceed the second reference current but exceeds the first reference current flows while the output current is changed and output over time. When the overcurrent exceeding the first reference current flows for a short time period, stable operation of the electronic device may be maintained, but when the time during which the overcurrent flows continues, overheating and damage of the electronic device may be caused. In type B or C, when overcurrent less than the second reference current and more than the first reference current flows, the overcurrent protection units 430 and 530 of the power converter may extract a difference between the output current exceeding the first reference current and the first reference current, may calculate an accumulative value obtained by integrating the difference with respect to time, may compare the accumulative value with a predetermined critical value, and may transmit a first detection result in which the accumulative value exceeds the critical value to the control unit 420 controlling the power conversion unit 510 or the power conversion unit 410, whereby the overcurrent protection operation in which the output current is stopped or paused at t2 or t3, respectively. That is, when the accumulative value indicating the continuation of the low overcurrent state exceeding the rated current exceeds the predetermined critical value, the overcurrent protection operation may be performed in the electronic devices 101, 201, and 301.

In type B, an accumulative value obtained by integrating a difference ΔI0B between the output current exceeding the first reference current in type B and the first reference current with respect to time may correspond to the area of a hatched region which is inclined in a clockwise direction from t0 to t2. When the area exceeds a critical value, a first detection result may be derived. In type C, an accumulative value obtained by integrating a difference ΔI0C between the output current exceeding the first reference current and the first reference current with respect to time may correspond to the area of a hatched region which is inclined in a counterclockwise direction from t0 to t3. When the area exceeds a critical value, a first detection result may be derived. Types B and C have different times when the overcurrent protection operation is performed, but the respective accumulated values and the critical values may be the same. In addition, type B and type C show a case in which the output current is constantly output, but the disclosure is not limited thereto, and the output current may be irregularly changed and output over time.

Figure 8:
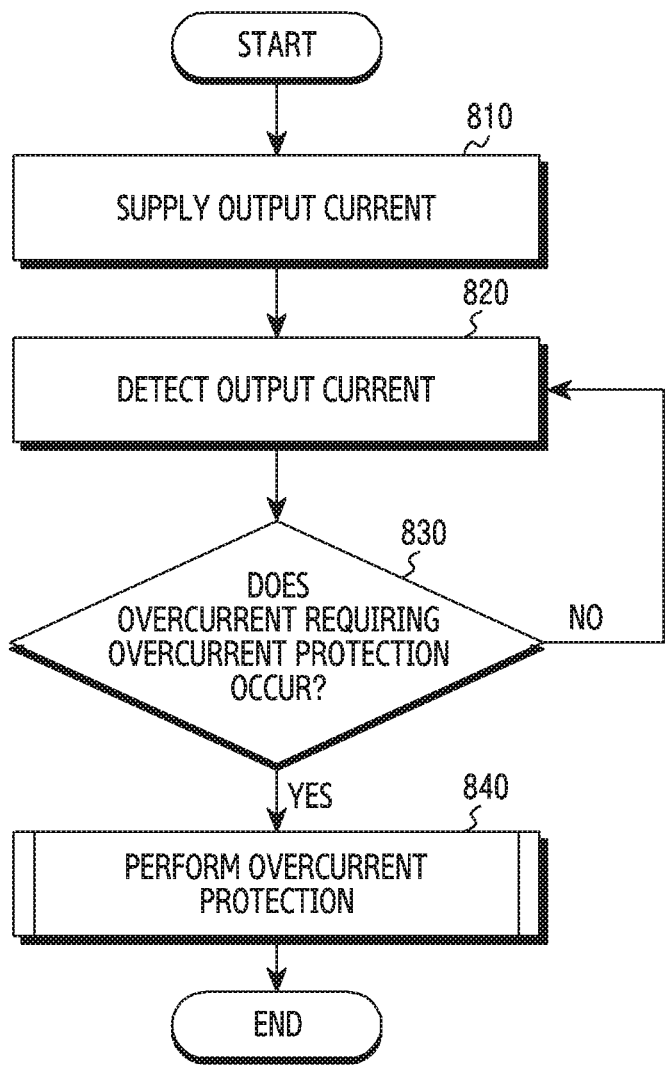
FIG. 8 is a flowchart illustrating an overcurrent protection method of an electronic device according to an embodiment of the disclosure.

FIG. 8 is a flowchart illustrating an overcurrent protection method of an electronic device according to an embodiment of the disclosure.

Referring to FIG. 8, an overcurrent protection method of an electronic device according to an embodiment may include supplying output current in operation 810, detecting the output current in operation 820, identifying whether overcurrent requiring overcurrent protection occurs in operation 830, and performing the overcurrent protection in operation 840. The operations included in the overcurrent protection method of the electronic device according to an embodiment may be performed in the electronic device including at least one power converter. For example, the at least one power converter may be the at least one power converter 230 illustrated in FIG. 2, the at least one power converter 330 illustrated in FIG. 3, the power converter 400 illustrated in FIG. 4A or 4B, the power converter 500 illustrated in FIG. 5A or 5B, or the power converter 600 illustrated in FIG. 6. In addition, the at least one power converter may include power conversion units 410, 510, 610-1, 610-2, and 610-*n* and overcurrent protection units 430, 530, 630-1, 630-2, and 630-*n*.

In operation 810, in the electronic device, the power conversion units 410, 510, 610-1, 610-2, and 610-*n* of the at least one power converter included in the electronic devices 101, 201, and 301 may convert input voltage or input current supplied by the power source or other power converters to match an output condition, and may supply the output current to devices in the electronic devices 101, 201, and 301. The output condition may be rated current, rated voltage, and rated power of the devices in the electronic devices 101, 201, and 301.

In operation 820, the electronic device may detect the output current output from the power converter in operation 810. The electronic device may convert the detected output current into voltage.

In operation 830, the electronic device may identify whether the output current is overcurrent requiring overcurrent protection. In operation 830, the electronic device may perform operation 840 when it is identified that the output current corresponds to the overcurrent requiring overcurrent protection, and may return to operation 820 to continuously detect the output current when it is identified that the output current does not correspond to the overcurrent requiring overcurrent protection. Detailed descriptions of operations 820 and 830 will be described later.

In operation 840, the electronic device may perform overcurrent protection when it is identified in operation 830 that the output current corresponds to the overcurrent requiring overcurrent protection. For example, the electronic device may stop the supply of the output current of the power converter to prevent overheating and damage of the devices in the electronic device due to the overcurrent. In another example, the electronic device may pause the supply of the output current of the power converter. Detailed description of operation 840 will be described later.

The overcurrent protection method of the electronic device according to an embodiment may further include notifying that the overcurrent requiring overcurrent protection has occurred. For example, the control unit 420 or the overcurrent protection units 430, 530, 630-1, 630-2, and 630-*n* may transmit, to the processor 120 of the electronic device, a warning signal indicating that the overcurrent requiring overcurrent protection has occurred and the operation of the power conversion units 410, 510, 610-1, 610-2, and 610-*n* is stopped while performing operation 840.

In addition, the overcurrent protection method of the electronic device according to an embodiment may further include displaying whether the output current is supplied, that is, displaying the operation state of the power converter. The overcurrent protection method of the electronic device according to an embodiment may further include notifying that the overcurrent requiring overcurrent protection has occurred in operation 840.

Figure 9:
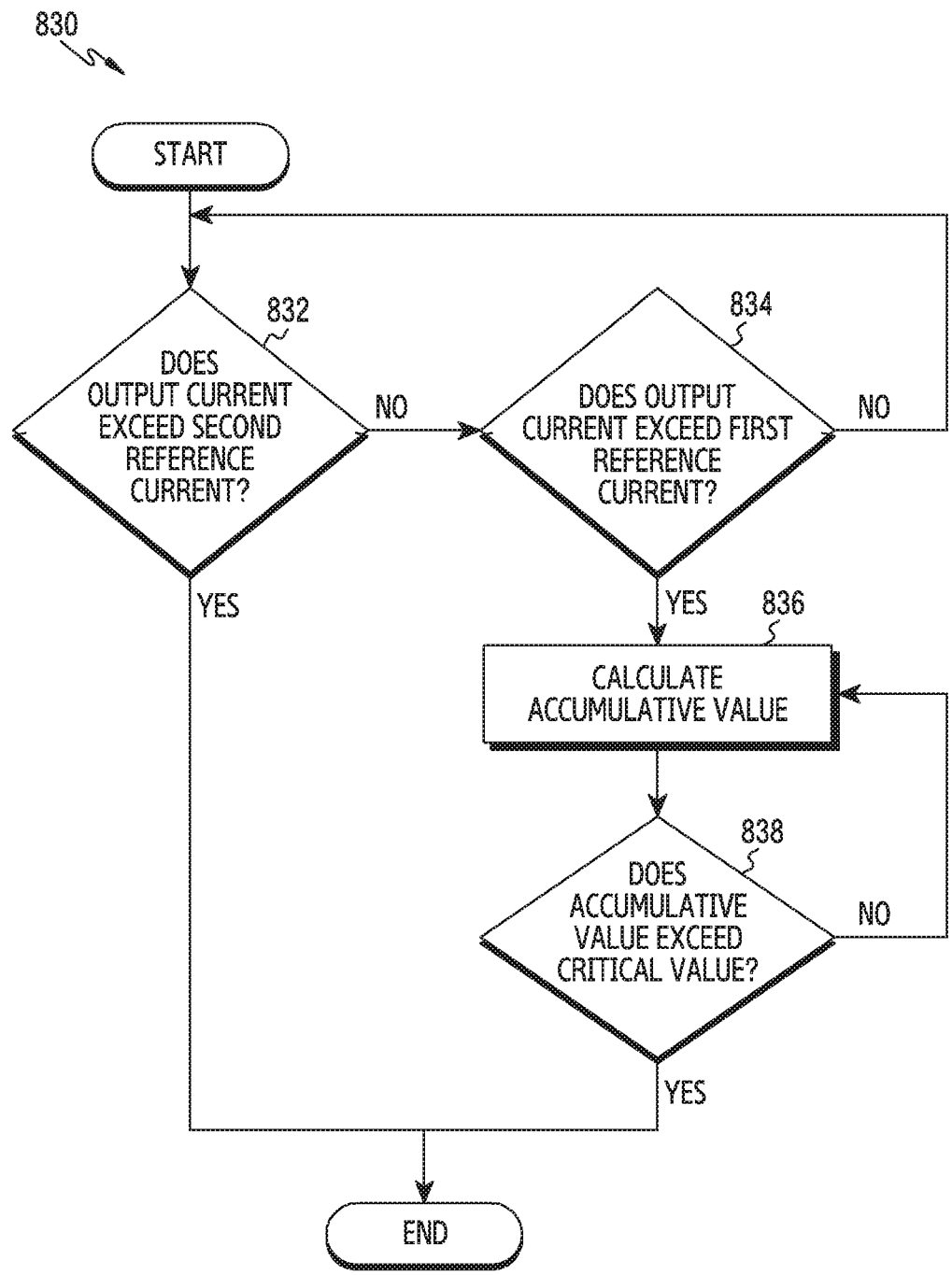
FIG. 9 is a flowchart illustrating a method of identifying an occurrence of overcurrent requiring overcurrent protection according to an embodiment of the disclosure.

FIG. 9 is a flowchart illustrating a method of identifying the occurrence of overcurrent requiring overcurrent protection according to an embodiment of the disclosure.

Referring to FIG. 9, in operation 832, the electronic device may compare the output current detected in operation 820 with a second predetermined reference current, and may determine whether the detected output current exceeds the second reference current. For example, the electronic device may compare voltage corresponding to the output current detected in operation 820 with voltage corresponding to the second reference current. In operation 832, when the detected output current exceeds the predetermined second reference current, operation 840 may be performed. In operation 832, operation 834 may be performed when the detected output current is equal to or less than the predetermined second reference current. For example, the second reference current may be generally designated as a constant value between 120% and 150% of the first reference current.

In operation 834, the electronic device may compare the output current detected in operation 820 with a predetermined first reference current, and may determine whether the detected output current exceeds the first reference current. For example, the electronic device may compare voltage corresponding to the output current detected in operation 820 with voltage corresponding to the first reference current. As to the first reference current, rated current of the power converter that outputs the detected output current may be designated in advance. Therefore, the second reference current is greater than the first reference current. In operation 834, when the detected output current exceeds the predetermined first reference current, operation 836 may be performed. In operation 834, when the detected output current is equal to or less than the predetermined first reference current, operation 820 may be performed.

In operation 836, the electronic device may calculate an accumulative value obtained by integrating a difference ΔIo between the output current exceeding the first reference current and the first reference current with respect to time. The electronic device may first extract the difference between the output current exceeding the first reference current and the first reference current and may integrate the extracted difference with respect to time. For example, the electronic device may extract the difference between the output current exceeding the first reference current and the first reference current using a differential amplifier, may use an analog-to-digital converter to convert the difference from an analog signal to a digital signal, and may use the integrator to calculate the accumulative value by integrating the different with respect to time. In addition, the calculated accumulative value may be initialized every predetermined time period. For example, the calculated accumulative value may be initialized every 5 minutes.

In operation 838, the electronic device may compare the accumulative value calculated in operation 836 with a predetermined critical value to determine whether the accumulative value exceeds the critical value. In operation 838, when the accumulative value calculated in operation 836 exceeds the predetermined critical value, operation 840 may be performed. In operation 838, when the calculated accumulative value is less than or equal to the critical value, operation 820 may be performed.

In a method of identifying the occurrence of the overcurrent requiring overcurrent protection of the electronic device according to an embodiment of the disclosure, conditions identified by the occurrence of the overcurrent requiring overcurrent protection may include at least two. In operation 838, overcurrent protection may be performed under the condition in which the accumulative value indicating the continuation of a low overcurrent condition exceeding the rated current exceeds a predetermined critical value. In operation 832, overcurrent protection may be performed under the condition in which the output current output in operation 810 exceeds the second reference current. According to the disclosure, it is possible to effectively protect the electronic devices 101, 201, and 301 including the at least one power converter from side effects due to the overcurrent.

Figure 10A:
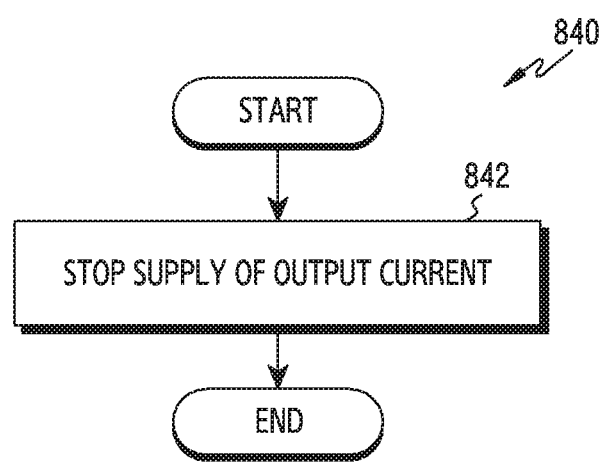
FIG. 10A is a flowchart illustrating an overcurrent protection operation of an electronic device according to an embodiment of the disclosure.
Figure 10B:
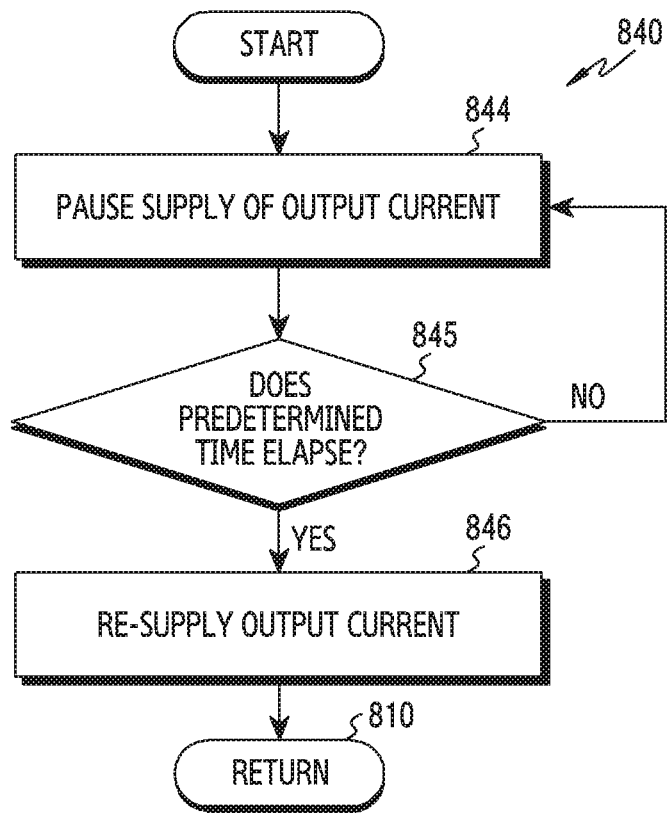
FIG. 10B is a flowchart illustrating an overcurrent protection operation of an electronic device according to an embodiment of the disclosure.
Figure 10C:
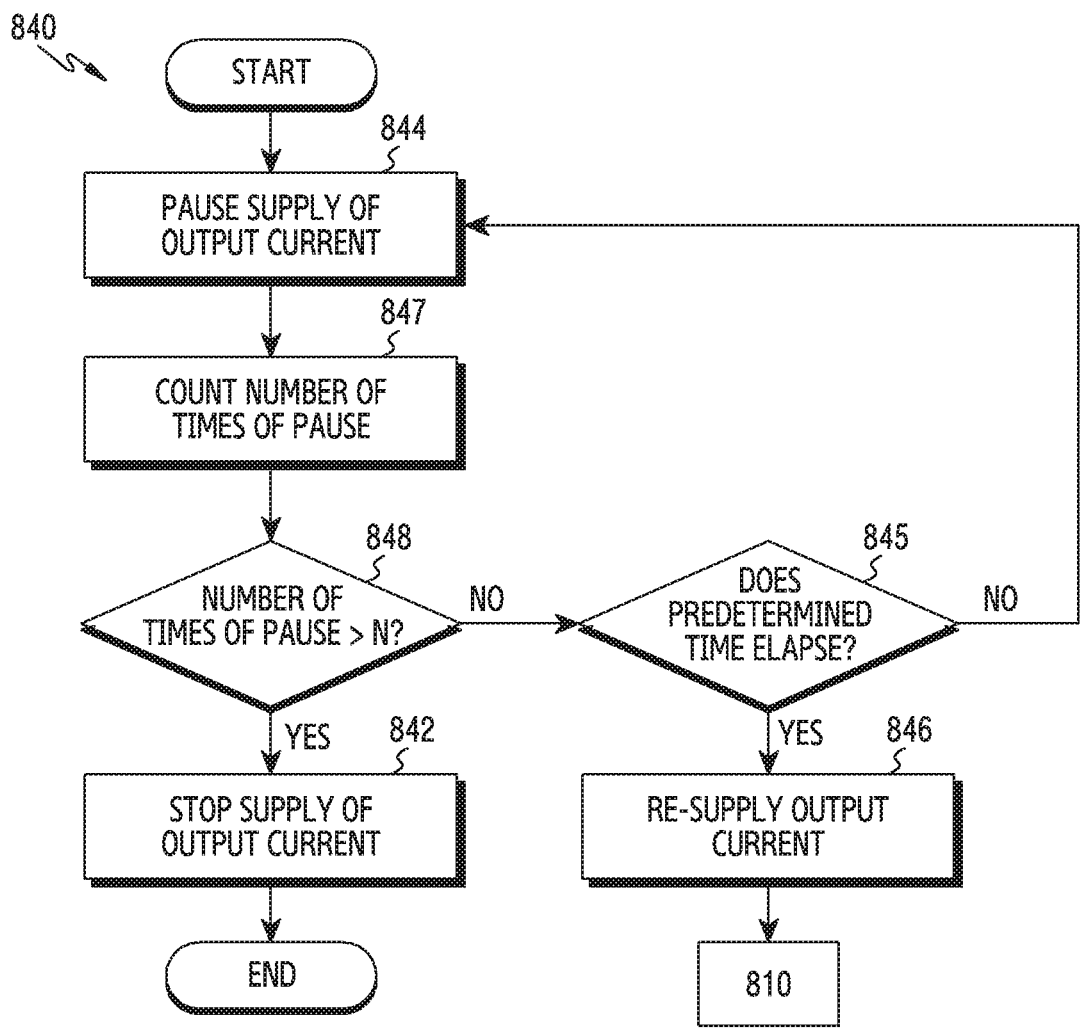
FIG. 10C is a flowchart illustrating an overcurrent protection operation of an electronic device according to still an embodiment of the disclosure.

FIG. 10A is a flowchart illustrating an overcurrent protection operation of an electronic device according to an embodiment of the disclosure. FIG. 10B is a flowchart illustrating an overcurrent protection operation of an electronic device according to an embodiment of the disclosure. FIG. 10C is a flowchart illustrating an overcurrent protection operation of an electronic device according to still an embodiment of the disclosure.

Referring to FIG. 10A, in operation 840 of overcurrent protection of an electronic device according to an embodiment, when it is determined in operation 830 that output current corresponds to overcurrent requiring overcurrent protection, the electronic device may stop the supply of the output current. Operation 842 corresponds to an operation in which the operation stoppage state is maintained unless the power converter is manually restarted. For example, in order to stop the supply of the output current, the electronic device may turn off a switch in the power conversion unit 410, 510, 610-1, 610-2, or 610-*n*. Operation 842 may be the first overcurrent protection operation illustrated in FIG. 11A, and may include the above description.

Referring to FIG. 10B, in operation 840 of overcurrent protection of an electronic device according to another embodiment, when it is determined in operation 830 that the output current corresponds to the overcurrent requiring overcurrent protection, the electronic device may pause the supply of the output current. Operation 844 is an operation of stopping the operation of the power converter and automatically restarting the power converter after a predetermined time has elapsed. In operation 845, the electronic device may determine whether a predetermined time has elapsed. The predetermined time is the time until the power converter is stopped and restarted, and corresponds to the time required for the devices of the electronic device or the power converter to cool the elevated temperature due to the overcurrent and required to maintain the electronic device so that they can be stably operated. When the time designated in operation 845 has elapsed, the electronic device may perform operation 846. When the time designated in operation 845 has not elapsed, the electronic device returns to operation 844 to maintain a state which the output current is paused. In operation 846, the electronic device may cause the output current to be re-supplied when the designated time has elapsed. When the output current is re-supplied, the electronic device may return to operation 810. Operation 844, operation 845, and operation 846 may be the second overcurrent protection operation illustrated in FIG. 11B, and may include the above description.

Referring to FIG. 10C, in operation 840 of overcurrent protection of an electronic device according to another embodiment, when it is determined in operation 830 that the output current corresponds to overcurrent requiring overcurrent protection, the electronic device may pause the supply of the output current. Operation 844 is an operation of stopping the operation of the power converter and automatically restarting the power converter after a predetermined time has elapsed. When an operation of pausing the output current occurs in operation 844, in operation 847, the electronic device may count the number of times operation 844 has occurred. For example, the electronic device may further include a counter (not shown) that counts the number of times of the occurrence of operation 844. The electronic device may count the number of times of the occurrence of operation 844 using the counter.

In operation 848, the electronic device may determine whether the number of times of the occurrence of operation 844 counted in operation 847 exceeds a predetermined number of times n. When the number of times of the occurrence of operation 844 exceeds the predetermined number of times, the electronic device may perform operation 842 of stopping the output current. That is, the electronic device may prevent the power converter from automatically restarting. When the number of times of the occurrence of operation 844 does not exceed the predetermined number of times, the electronic device may perform operation 845. In operation 840 of overcurrent protection of the electronic device according to still another embodiment, when the output current corresponds to the overcurrent requiring overcurrent protection, the electronic device may identify whether the number of times of the occurrence of operation 844 exceeds the predetermined number of times in a mode of operation 844 of pausing the output current. In the case in which the number of times of the occurrence of operation 844 exceeds the predetermined number of times, when the output current corresponds to the overcurrent requiring overcurrent protection in the mode of operation 844, the electronic device may switch the output current to a mode of operation 842 of stopping the output current.

In one embodiment, an electronic device (e.g., the electronic device 101, 201, or 301) according to example 1 may include at least one power converter (e.g., the power converter 230, 330, 400, 500, or 600), and the at least one power converter may include: a power conversion unit configured to convert input voltage or input current to supply output current; a control unit configured to adjust the output current; and an overcurrent protection unit configured to detect the output current and transmit a detection result to the control unit. The overcurrent protection unit may include: an overcurrent extraction module configured to output a difference between the output current exceeding designated first reference current and the first reference current; a calculation module configured to calculate an accumulative value obtained by integrating the difference with respect to time; and a first comparison module configured to compare the accumulative value with a designated critical value and to transmit a first detection result in which the accumulative value exceeds the critical value to the control unit.

In example 2 of the disclosure, the overcurrent protection unit according to example 1 may further include a second comparison module configured to compare the output current with second reference current larger than the first reference current and to transmit a second detection result in which the output current exceeds the second reference current to the control unit.

In example 3 of the disclosure, the control unit according to example 1 and example 2 may stop the supply of the output current based on the first detection result or the second detection result.

In example 4 of the disclosure, the control unit according to example 1 to example 3 may pause the supply of the output current so that the output current is re-supplied after a predetermined time elapses based on the first detection result or the second detection result.

In example 5 of the disclosure, the at least one output converter according to example 1 to example 4 may include a counter configured to count the number of times the supply of the output current is paused, and the control unit may pause the supply of the output current so that the output current is re-supplied after a predetermined time elapses based on the first detection result or the second detection result and may stop the supply of the output current to prevent the output current from being re-supplied when the counted number of times exceeds the predetermined number of times.

In example 6 of the disclosure, the overcurrent extraction module according to example 1 to example 5 may include a differential amplifier.

In example 7 of the disclosure, the overcurrent extraction module according to example 1 to example 6 may further include an analog-to-digital converter (ADC).

In one embodiment, an electronic device (e.g., the electronic device 101, 201, or 301) according to example 8 may include at least one power converter (e.g., the power converter 230, 330, 400, 500, or 600), and the at least one power converter may include: a power conversion unit configured to convert input voltage or input current to supply output current; and an overcurrent protection unit configured to detect the output current and to transmit a detection result to the power conversion unit to adjust the output current. The overcurrent protection unit may include: an overcurrent extraction module configured to output a difference between the output current exceeding designated first reference current and the first reference current; a calculation module configured to calculate an accumulative value obtained by integrating the difference with respect to time; and a first comparison module configured to compare the accumulative value with a designated critical value and to transmit a first detection result in which the accumulative value exceeds the critical value to the power conversion unit.

In example 9 of the disclosure, the overcurrent protection unit according to example 8 may further include a second comparison module configured to compare the output current with second reference current larger than the first reference current and to transmit a second detection result in which the output current exceeds the second reference current to the power converter.

In example 10 of the disclosure, the power converter according to example 8 and example 9 may stop the supply of the output current based on the first detection result or the second detection result.

In example 11 of the disclosure, the power converter according to example 8 to example 10 may pause the supply of the output current so that the output current is re-supplied after a predetermined time elapses based on the first detection result or the second detection result.

In example 12 of the disclosure, the at least one power converter according to example 8 to example 11 may include a counter configured to count the number of times the supply of the output current is paused, and the power converter may pause the supply of the output current so that the output current is re-supplied after a predetermined time elapses based on the first detection result or the second detection result and may stop the supply of the output current to prevent the output current from being re-supplied when the counted number of times exceeds the predetermined number of times.

In example 13 of the disclosure, the overcurrent extraction module according to example 8 to example 12 may include a differential amplifier.

In example 14 of the disclosure, the overcurrent extraction module according to example 8 to example 13 may further include an ADC.

In one embodiment, an overcurrent protection method according to example 15 may include: converting input voltage or input current to supply output current; outputting a difference between the output current exceeding designated first reference current and the first reference current; calculating an accumulative value obtained by integrating the difference with respect to time; and comparing the accumulative value with a designated critical value and transmitting a first detection result in which the accumulative value exceeds the critical value.

In example 16 of the disclosure, the method of example 15 may further include: comparing the output current with second reference current larger than the first reference current and transmitting a second detection result in which the output current exceeds the second reference current.

In example 17 of the disclosure, the method of example 15 and example 16 may further include stopping the output current based on the first detection result or the second detection result.

In example 18 of the disclosure, the method of example 15 to example 17 may further include: pausing the output current so that the output current is re-supplied after a predetermined time elapses based on the first detection result or the second detection result.

In example 19 of the disclosure, the method of example 15 to example 18 may further include: pausing the output current so that the output current is re-supplied after a predetermined time elapses based on the first detection result or the second detection result; counting the number of times the supply of the output current is paused; and stopping the supply of the output current to prevent the output current from being re-supplied when the counted number of times exceeds the predetermined number of times.

In example 20 of the disclosure, the method of example 15 to example 19 may further include: notifying that the output current is overcurrent requiring overcurrent protection based on the first detection result or the second detection result.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The scope of protection is defined by the accompanying independent claims. Additional features are specified by the appended dependent claims. Example implementations may be realized by including one or more features, taken jointly and individually, in any and all permutations, from any claim.

The examples described in this disclosure include non-limiting example implementations of components corresponding to one or more features specified by the appended independent claims, and these features (or their corresponding components), individually or in combination, can contribute to improving one or more technical problems that can be deduced by those skilled in the art from this disclosure.

Further, one or more selected components of any one example described in this disclosure can be combined with one or more selected components of another one or more examples described in this disclosure, or alternatively in combination with the features of the attached independent claims, additional alternative examples can be formed.

Additional example implementations can be realized by including one or more components taken jointly and individually, in any and all permutations, from any implementation described in the disclosure. Still other example implementations may also be realized by combining one or more features of the appended claims with one or more selected components of any example implementation described in this disclosure.

In forming such additional example implementations, some components of any example implementation described in this disclosure may be omitted. One or more components that may be omitted are components that can be directly and clearly understood by those skilled in the art that in light of the technical problems discernable from the disclosure, it is not so essential to the functionality of the technology. It would be recognized that a person skilled in the art does not need to modify other components or features of the further alternative example to compensate for the change even if these omitted components are replaced or removed. Accordingly, further example implementations may be included within the disclosure, in accordance with the present technology, although selected combinations of features and/or components are not specifically mentioned.

In any described example implementation described in the disclosure, two or more physically separate components may alternatively be integrated into a single component if the integration is possible. If the same function is performed by the single component formed in this manner, the integration is possible. Conversely, a single component of any embodiment described in the disclosure may alternatively, if appropriate, be implemented with two or more separate components that achieve the same function.

What is claimed is:

1. An electronic device comprising:
   at least one power converter,
   wherein the at least one power converter comprises:
      a power conversion unit configured to convert an input voltage or an input current to supply an output current,
      a control unit configured to adjust the output current, and
      an overcurrent protection unit configured to detect the output current and transmit a detection result to the control unit, and
   wherein the overcurrent protection unit comprises:
      an overcurrent extraction module configured to output a difference between the output current exceeding a designated first reference current and the designated first reference current,
      a calculation module configured to calculate an accumulative value obtained by integrating the difference with respect to time,
      a first comparison module configured to:
         compare the accumulative value with a designated critical value, and
         transmit a first detection result in which the accumulative value exceeds the designated critical value to the control unit, and
      a second comparison module configured to:
         compare the output current with second reference current larger than the first reference current, and
         transmit a second detection result in which the output current exceeds the second reference current to the control unit.

2. The electronic device of claim 1, wherein the control unit is configured to stop the supply of the output current based on the first detection result or the second detection result.

3. The electronic device of claim 1, wherein the control unit is configured to pause the supply of the output current so that the output current is re-supplied after a predetermined time elapses based on the first detection result or the second detection result.

4. The electronic device of claim 3,
   wherein the at least one power converter further comprises a counter configured to count a number of times the supply of the output current is paused, and
   wherein the control unit is further configured to:
      pause the supply of the output current so that the output current is re-supplied after a predetermined time elapses based on the first detection result or the second detection result, and
      stop the supply of the output current to prevent the output current from being re-supplied when the counted number of times exceeds a predetermined number of times.

5. The electronic device of claim 1, wherein the overcurrent extraction module comprises a differential amplifier.

6. The electronic device of claim 5, wherein the overcurrent extraction module further comprises an analog-to-digital converter (ADC).

7. An electronic device comprising:
at least one power converter,
wherein the at least one power converter comprises:
   a power conversion unit configured to convert an input voltage or an input current to supply an output current, and
   an overcurrent protection unit configured to:
      detect the output current, and
      transmit a detection result to the power conversion unit to adjust the output current, and
   wherein the overcurrent protection unit comprises:
      an overcurrent extraction module configured to output a difference between the output current exceeding a designated first reference current and the designated first reference current,
      a calculation module configured to calculate an accumulative value obtained by integrating the difference with respect to time,
      a first comparison module configured to:
         compare the accumulative value with a designated critical value, and
         transmit a first detection result in which the accumulative value exceeds the designated critical value to the power conversion unit, and
      a second comparison module configured to:
         compare the output current with second reference current larger than the first reference current, and
         transmit a second detection result in which the output current exceeds the second reference current to the power conversion unit.

8. The electronic device of claim 7, wherein the power conversion unit is configured to stop the supply of the output current based on the first detection result or the second detection result.

9. The electronic device of claim 7, wherein the power conversion unit is configured to pause the supply of the output current so that the output current is re-supplied after a predetermined time elapses based on the first detection result or the second detection result.

10. The electronic device of claim 9,
wherein the at least one power converter comprises a counter configured to count a number of times the supply of the output current is paused, and
wherein the power conversion unit is configured to:
   pause the supply of the output current so that the output current is re-supplied after a predetermined time elapses based on the first detection result or the second detection result, and
   stop the supply of the output current to prevent the output current from being re-supplied when the counted number of times exceeds a predetermined number of times.

11. The electronic device of claim 7, wherein the overcurrent extraction module comprises a differential amplifier.

12. The electronic device of claim 11, wherein the overcurrent extraction module further comprises an analog-to-digital converter (ADC).

13. An overcurrent protection method of an electronic device, the method comprising:
   converting an input voltage or an input current to supply an output current;
   outputting a difference between the output current exceeding a designated first reference current and the designated first reference current;
   calculating an accumulative value obtained by integrating the difference with respect to time;
   comparing the accumulative value with a designated critical value and transmitting a first detection result in which the accumulative value exceeds the designated critical value; and
   comparing the output current with second reference current larger than the first reference current and transmitting a second detection result in which the output current exceeds the second reference current.

14. The overcurrent protection method of claim 13, further comprising:
   stopping the output current based on the first detection result or the second detection result.

15. The overcurrent protection method of claim 13, further comprising:
   pausing the output current so that the output current is re-supplied after a predetermined time elapses based on the first detection result or the second detection result.

16. The overcurrent protection method of claim 13, further comprising:
   pausing the output current so that the output current is re-supplied after a predetermined time elapses based on the first detection result or the second detection result;
   counting the number of times the supply of the output current is paused; and
   stopping the supply of the output current to prevent the output current from being re-supplied when the counted number of times exceeds the predetermined number of times.

17. The overcurrent protection method of claim 13, further comprising:
   notifying that the output current is overcurrent requiring overcurrent protection based on the first detection result or the second detection result.

* * * * *